United States Patent
Reich et al.

(10) Patent No.: US 10,698,004 B2
(45) Date of Patent: Jun. 30, 2020

(54) MEASUREMENT DEVICE AND METHOD FOR MEASURING AT LEAST ONE SIGNAL

(71) Applicant: Rohde & Schwarz GmbH & Co. KG, Munich (DE)

(72) Inventors: Friedrich Reich, Stadtbergen (DE); Ferdinand Mayet, Munich (DE); Wolfgang Herbordt, Ottobrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 475 days.

(21) Appl. No.: 14/730,463

(22) Filed: Jun. 4, 2015

(65) Prior Publication Data

US 2016/0299181 A1 Oct. 13, 2016

Related U.S. Application Data

(60) Provisional application No. 62/144,152, filed on Apr. 7, 2015.

(51) Int. Cl.
*H03F 1/26* (2006.01)
*G01R 13/02* (2006.01)
*G01R 23/16* (2006.01)

(52) U.S. Cl.
CPC .......... *G01R 13/0263* (2013.01); *G01R 23/16* (2013.01)

(58) Field of Classification Search
CPC .............. G01R 13/0263; G01R 23/16
USPC ......................................... 702/189
See application file for complete search history.

(56) References Cited

U.S. PATENT DOCUMENTS

| 8,990,035 | B2 * | 3/2015 | Serra | G01R 31/1227 702/58 |
| 2004/0119620 | A1 * | 6/2004 | Tran | G01R 13/32 341/126 |
| 2013/0158923 | A1 * | 6/2013 | Stanton | G01R 13/0254 702/76 |
| 2014/0358469 | A1 * | 12/2014 | Graf | G01D 11/00 702/127 |

FOREIGN PATENT DOCUMENTS

| DE | 102010020910 | 6/2011 |
| EP | 2733495 | 5/2014 |

* cited by examiner

*Primary Examiner* — Toan M Le
*Assistant Examiner* — Xiuqin Sun
(74) *Attorney, Agent, or Firm* — Lee & Hayes, P.C.

(57) ABSTRACT

A measurement device for measuring at least one signal generates a first trigger impulse upon detection of a first trigger condition in at least one signal to be measured. It stores for the at least one signal multiple segments each containing the detected first trigger condition upon generation of the first trigger impulse in an acquisition memory. A second trigger impulse is generated upon detection of a second trigger condition in the multiple segments of the at least one signal stored in the acquisition memory. For the at least one signal the segments containing the detected second trigger condition are displayed upon generation of the second trigger impulse on a display unit.

20 Claims, 6 Drawing Sheets

MEASUREMENT DEVICE AND METHOD FOR MEASURING AT LEAST ONE SIGNAL

RELATED PATENT APPLICATION

This application claims priority to Provisional Application No. 62/144,152 filed on Apr. 7, 2015 entitled "Measurement device and method for measuring at least one signal", which is incorporated here by reference in its entirety.

FIELD OF THE INVENTION

The invention relates to a measuring device and a method for measuring at least one signal in the time or frequency domain.

BACKGROUND OF THE INVENTION

The detection of rare or stochastic events in a signal to be measured is difficult in conventional trigger modes such as level triggering or slope triggering. The use of mask triggering enables an improvement in the detection of such signal anomalies.

In EP 2 733 495 A1 a measurement device and a method for measuring a signal in the time domain or frequency domain is described. With the aid of a mask defined over a specific time period or a specific frequency range a single event or statistical events in the signal or in the spectrum of the signal within the time period or the frequency range can be detected.

However, a detection of a signal anomaly in a trigger unit of the measurement device is disadvantageously only possible within a limited time or within a limited frequency range, respectively. This is due to the limited processing power for realizing the triggering in real time and the limited acquisition memory size for storing a lot of acquired samples.

Therefore one object of the invention among others is to develop a measurement device and a method for measuring at least one signal containing rare or statistical events spread over a large period of time or over a large frequency range respectively.

SUMMARY OF THE INVENTION

According to one aspect of the invention a measurement device and a method for measuring at least one signal detects in a first trigger an event in the at least one signal to be measured and generates a first trigger impulse. The generated first trigger impulse results in a storage of the segment of the at least one signal to be measured containing the detected event in an acquisition memory. Preferably, the acquisition memory is realized as a so called history memory enabling to store multiple sequences of the at least one signal to be measured each containing an event detected by the first trigger unit. Preferably, both the first trigger unit and the acquisition memory run in real time. A second trigger unit succeeding the acquisition memory additionally detects rare or statistical events all over the sequences of the at least one signal which are stored in the acquisition memory. The second trigger unit generates a second trigger signal in the detection of a rare or statistical event all over the sequences of the at least one signal stored in the acquisition memory. With the generated second trigger signal the sequence of the at least one signal containing the detected rare or statistic trigger event is displayed on a display unit.

The detection of rare or statistical events all over the sequences of the at least one signal stored in the acquisition memory is preferably performed in the so-called batch mode during the offline or non-real-time phase after signal acquisition which is performed in real-time. The second triggering in offline mode enables the processing of a huge amount of signal data over multiple sequences of the at least one signal stored in the acquisition memory. The acquisition memory operating in history mode enables the detection of rare or statistical events all over the sequences of the at least one signal stored in the acquisition memory in offline mode.

Consequently, rare or statistical events spread over a large period of time can be detected and displayed on the display unit of the measurement device.

Preferably, on the display unit the sequences of the at least one signal stored in the acquisition memory without any detection of rare or statistical events by means of the second trigger are displayed in addition to the sequence of the at least one signal containing the rare or statistical event detected by means of the second trigger unit.

Preferably, for differentiating a sequence of the at least one signal without any detection of rare or statistical events by means of the second trigger from a sequence of the at least one signal triggered by the second trigger unit different colors or different types of lines are used in the display.

By preference, the sequences of the at least one signal without any detection of rare or statistical events by means of the second trigger and the sequences of the at least one signal triggered by the second trigger unit are displayed in different display areas of the display.

Preferably, the second trigger unit uses a mask trigger in order to securely detect rare or statistical events in the at least one signal to be measured. The user of the measurement device may define the course of the mask for example by means of polygons. The second trigger impulse is only generated, if the signal is positioned inside the defined mask. Alternatively, the second trigger impulse is only generated, if the signal is positioned outside the defined mask. Alternatively, a logical combination of multiple different masks can be defined by the user and can be used in the second trigger unit.

By preference, the inventive measurement device and the inventive method for measuring a signal can be used for time domain signals or for frequency domain signals, i.e. the spectrum of a time dependent signal.

In a first preferred embodiment of the invention the segments of the at least one measured signal containing a detected second trigger event are labeled in the acquisition memory, whereas the segments of the at least one measured signal without any detected second trigger event remain unlabeled in the acquisition memory.

Alternatively, each segment of the at least one measured signal without any detected second trigger event is deleted in the acquisition memory for decreasing the volume of signal data in the acquisition memory. In the first preferred embodiment of the invention the labeled or unlabeled segments of the at least one measured signal in the acquisition memory are optionally post-processed for a second time.

In a second preferred embodiment of the invention each segment of the at least one measured signal with a detected second trigger event is stored as labeled segment in an auxiliary memory succeeding the unit for signal post-processing directly after second triggering. In the second preferred embodiment of the invention the segments of the at least one measured signal with the detected second trigger event are not post-processed for a second time.

In a third preferred embodiment of the invention each segment of the at least one measured signal with a detected second trigger event is loaded as labeled segment in the display memory directly after second triggering. In the third preferred embodiment of the invention the segments of the at least one measured signal with the detected second trigger event are also not post-processed for a second time.

BRIEF DESCRIPTION OF THE DRAWINGS

In the following, the invention is described on the basis of the drawings which present an advantageous exemplary embodiment of the invention by way of example only. The figures of the drawings show.

DETAILED DESCRIPTION OF THE PREFERRED EMBODIMENTS

Figure 1A:
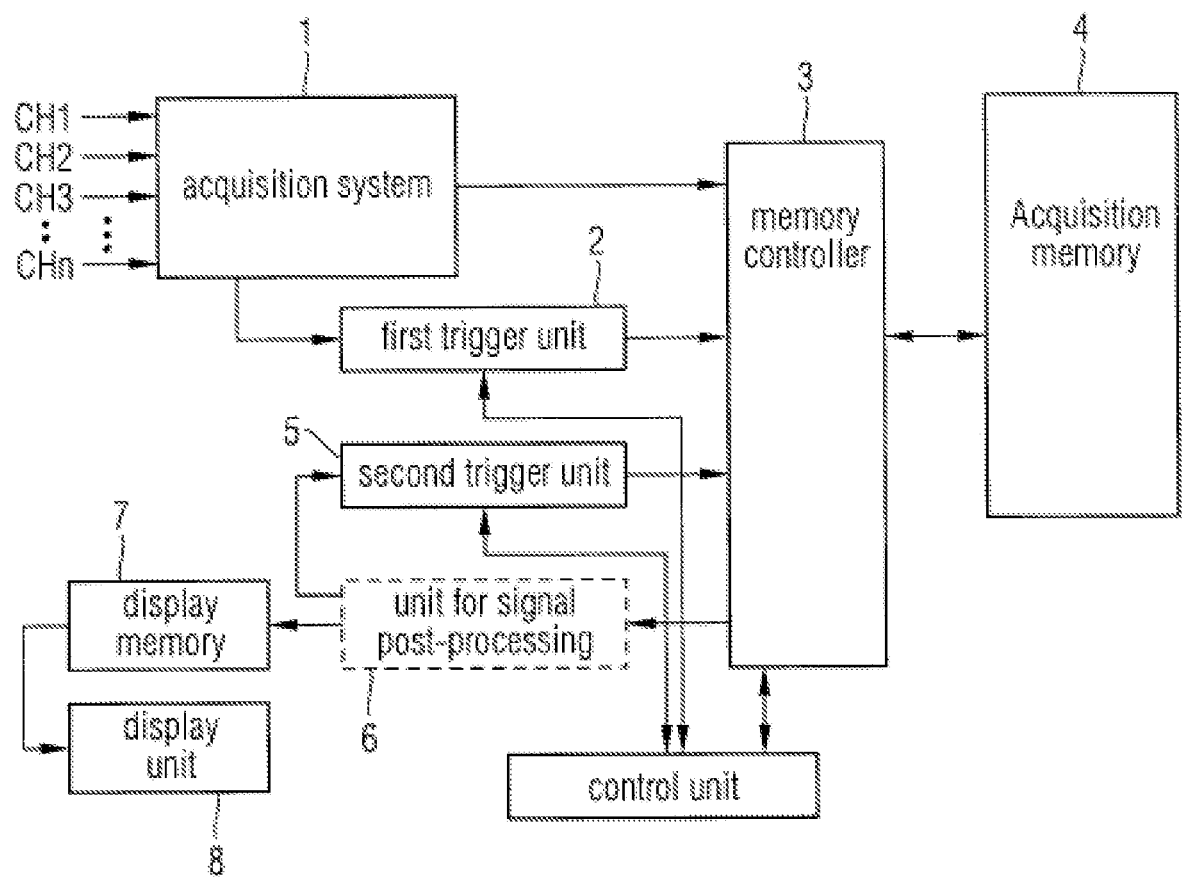
FIG. 1A a first embodiment of a block diagram of an inventive measurement device, FIG. 1B a second embodiment of a block diagram of an inventive measurement device, FIG. 1C a third embodiment of a block diagram of an inventive measurement device, FIG. 2A a flowchart of a first embodiment of an inventive method for measuring at least one signal, FIG. 2B a flowchart of a second embodiment of an inventive method for measuring at least one signal and FIG. 2C a flowchart of a third embodiment of an inventive method for measuring at least one signal.

Initially, with reference to FIGS. 1A to 1C, the general object and function of three exemplary embodiments of the measurement device according to the invention will be explained. With reference to FIGS. 2A to 2C, the functioning of three exemplary embodiments of the method for measuring at least one signal according to the invention will be explained.

In the first method step S10 of the first embodiment of the inventive method for measuring at least one signal according to FIG. 2A at least one signal is measured in a corresponding activated measuring channel CH1, CH2, CH3, . . . , CHn. The at least one measured signal is typically stored after conventional signal processing such as filtering, amplifying and analog-to-digital-conversion in an input memory stage of the acquisition system 1, shown in FIG. 1A.

In the next method step S20 a first trigger unit 2 detects first trigger events in the at least one measured signal on the basis of a first trigger condition pre-defined by the user of the measurement device. The first trigger condition may be a conventional trigger function such as a level trigger or a slope trigger or a delay-time trigger and so on. In the case of multiple measured signals a combination of several trigger functions each for one measured signal can be used in the first trigger condition. If the first trigger unit 2 detects an event in the at least one measured signal fitting to the pre-defined first trigger condition, a first trigger impulse is generated in the first trigger unit 2.

In the next method step S30, with the generated first trigger impulse a segment of each measured signal containing the trigger event is stored in the acquisition system 1 via the memory controller 3 to the memory space of an acquisition memory 4 determined from the memory controller 3. In this example, the segment in each measured signal comprises a pre-trigger range preceding the detected trigger event and a post-trigger range succeeding the detected trigger event. Both the length of the pre-trigger range and the length of the post-trigger range can be selected by the user of the measurement device.

Both the first triggering in the first trigger unit 2 and the storage of a segment of each measured signal in the acquisition memory 4 by means of the memory controller 3 are preferably performed in real time.

Preferably, the acquisition memory 4 has enough memory space to store multiple segments of each measured signal and can thus be used for storing triggering events over a long period of time. A history mode of the acquisition memory 4 can thus be realized. In the history mode only sequences of samples are stored in the acquisition memory 4 which contain the sample of the corresponding identified trigger event and a number of samples in the corresponding pre-trigger phase and a number of samples in the corresponding post-trigger phase. All segments stored in acquisition memory 4 in the history mode can be evaluated repeatedly by the second trigger unit. Thus, in the history mode a given number of past acquisitions is available for later analysis and can be played back by the user as often as desired.

Signal post-processing is performed to the segments of each measured signal stored in the acquisition memory 4 in an unit for signal post-processing 6 succeeding the acquisition memory 4 and the memory controller 3 in the next method step S40 which is performed optionally. Hereby, the user of the measuring device has the choice to activate or to deactivate the signal post-processing.

The signal post-processing includes for example statistical calculations or signal optimizing function such as interpolation or filtering on the segments of each measured signal stored in the acquisition memory 4.

The signal post-processing functions require a comparatively high processing power demand and are thus preferably performed in the offline mode in non-real-time.

In the following method step S50 a second trigger unit 5 succeeding the unit for signal post-processing 6 detects a second trigger event in the sequences of the at least one measured signal stored in the acquisition memory 4—in case of deactivated signal post-processing—or in the to signal processing results delivered by the unit for signal post-processing 6—in case of activated signal post-processing—according to a second trigger condition pre-defined by the user of the measurement device and generates a corresponding second trigger impulse.

The second trigger condition can be a comparatively complex trigger condition requiring a comparatively higher demand in processing power as the first trigger condition. Consequently, the second triggering is performed in a phase after acquisition, in which enough time for high volume processing is present. The second triggering is thus performed in the offline mode which does not represent a real time mode.

Preferably, the second trigger is a mask trigger defining an upper polygon curve and a lower polygon curve over a period of time in case of a time domain signal stored in the acquisition memory 4 resp. delivered by the unit for signal post-processing 6 or over a frequency range in case of a frequency domain signal, i.e. a spectrum of a time dependent signal. Alternatively, another complex trigger function such as a modulation trigger and so on can be used as the second trigger. Other shapes of masks such circles are possible.

Furthermore, a logical combination of multiple different masks can be defined by the user and can be used in the second trigger unit. All the different masks can be used to identify second trigger events in segments stored in the acquisition memory 4 for only one measured signal. Alternatively, each different mask can be used to identify second trigger events in segments stored in the acquisition memory 4 for only one corresponding measured signal.

In a first trigger mode selected by the user of the measurement device a second trigger impulse is only generated by the second trigger unit 5, if each signal in its total segment stored in the acquisition memory 4 resp. delivered by the unit for signal post-processing 6 violates the trigger mask. The violation of the trigger mask occurs, if at least one sample is inside the trigger mask. Alternatively, in a second trigger mode selected by the user of the measurement device a second trigger impulse is only generated by the second trigger unit 5, if at least one signal of all the measured signals is in its total segment stored in the acquisition memory 4 resp. delivered by the unit for signal post-processing 6 outside the trigger mask.

Depending on the selected trigger mode the segment of each measured signal stored in the acquisition memory 4 is labeled in the next method step S60 if the second trigger unit 5 performing a mask triggering detects a trigger event in that segment of the measured signal or in the corresponding post-processing results of that segment and consequently generates a second trigger impulse in a first inventive variant.

In a second inventive variant the segment of each measured signal remains in the acquisition memory 4 in the next method step S60, if the second trigger unit 5 performing a mask triggering detects a trigger event in that segment of the measured signal or in the corresponding post-processing results of that segment and consequently generates a second trigger impulse. The segment of each measured signal is deleted in the acquisition memory 4, if the second trigger unit 5 performing a mask triggering does not detect a trigger event in that segment of the measured signal or in the corresponding post-processing results of that segment. The deletion of segments of the measured signal without any second trigger events in the second inventive variant advantageously results in a decreased demand on acquisition memory size.

After the storage of a specific and pre-selected number of segments of each measured signal in the acquisition memory 4 and after completion of the detection of second trigger events in the specific and pre-selected number of segments of each measured signal, the signal post-processing is performed for the second time to the segments of each measured signal stored in the acquisition memory 4 in the unit for signal post-processing 6 succeeding the acquisition memory 4 and the memory controller 3 in the next method step S70, if the option signal post-processing is activated by the user of the measuring device. Thus depending on the inventive variant signal post-processing is performed on segments of each measured signal containing both a first trigger event and a second trigger event or on segments of each measured signal containing only a first trigger event.

In the next method step S80 all the segments of each measured signal stored in the acquisition memory 4—in case of deactivated signal post-processing—or all the segments of each measured signal stored in the acquisition memory 4 together with the results of the signal post-processing—in case of the activated signal post-processing—are transferred to the display memory 7 succeeding the unit for signal post-processing 6.

Hereby, in the first inventive variant only labeled segments of each measured signal stored in the acquisition memory 4, i.e. segments containing both a first trigger event and a second trigger event, are transferred to the display memory 7 or alternatively all labeled and unlabeled segments of each measured signal are transferred to the display memory 7. In the second inventive variant all segments of each measured signal stored in the acquisition memory 4, i.e. segments containing both a first trigger event and a second trigger event, are transferred to the display memory 7 to store the signal data as pixel data in the display memory 7.

In the last method step S90 the segments of each measured signal and the results of the signal post-processing stored in the display memory 7 are displayed on the display unit 8.

If in a first display variant labeled and unlabeled segments of each measured signal, i.e. segments of each measured signal with detected second trigger events and segments of each measured signal without any detected second trigger events, are transferred and stored in the display memory 7, the segments of each measured signal with detected second trigger events are displayed in another visual type as the segments of each measured signal without any detected second trigger events. Different visual type can be for example a different color in which the segments of each measured signal are displayed or a different type of line, i.e. bold line and normal line or dashed line and dotted line and so on, in which the segments of each measured signal are displayed.

In a second display variant the segments of each measured signal with detected second trigger events and segments of each measured signal without any detected second trigger events are displayed in two different display areas of the display unit 8.

The first method steps S100 to S140 of the second embodiment of the inventive method according to FIG. 2B correspond to the method steps S10 to S50 of the first embodiment of the inventive method according to FIG. 2A and consequently are now not described repetitively.

In the next method step S150 of the second embodiment of the inventive method each segment of each measured signal in which the second trigger unit 5 identifies a second trigger event is labeled by the second trigger unit 5.

Figure 1B:
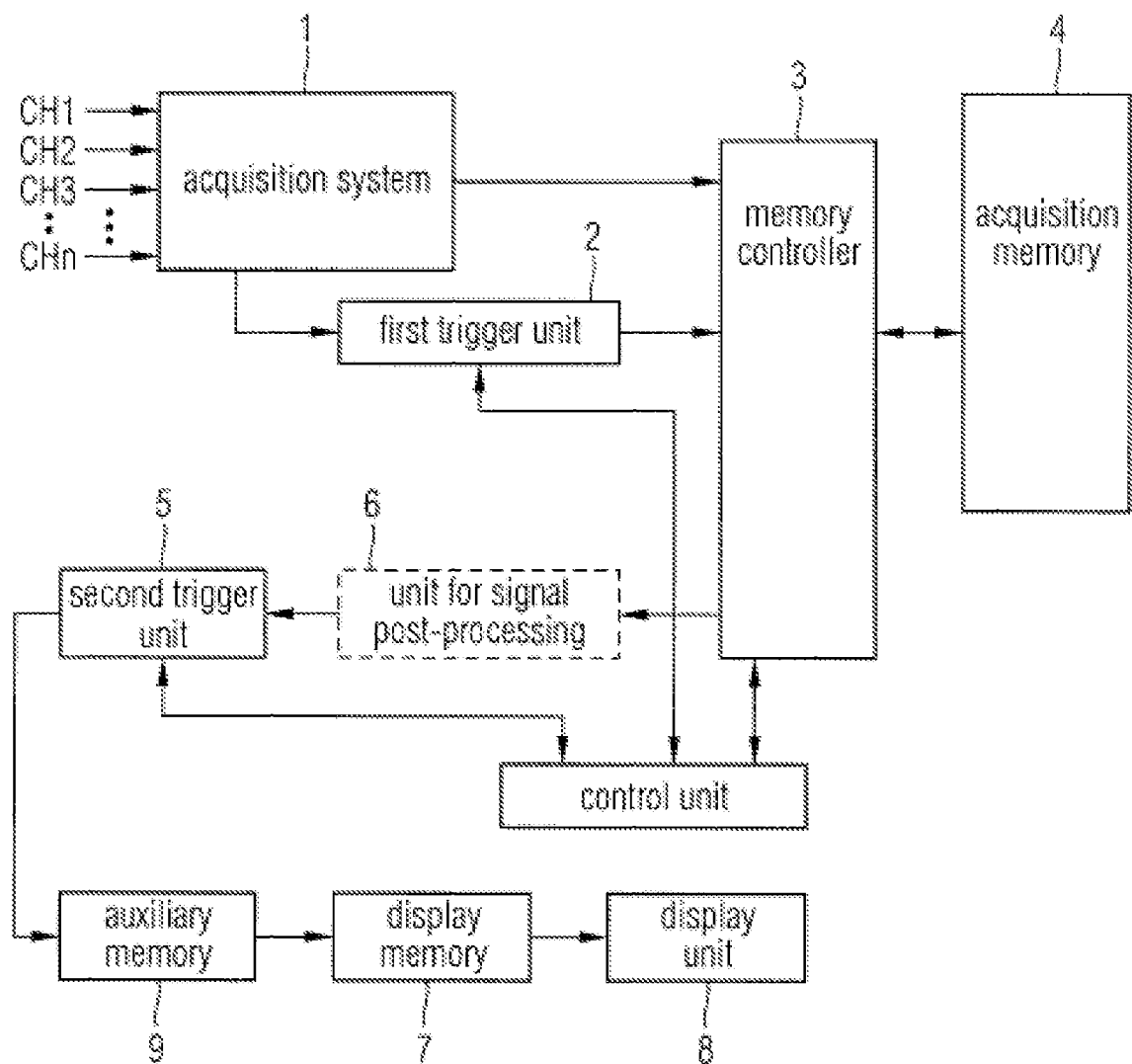
Figure 2A:
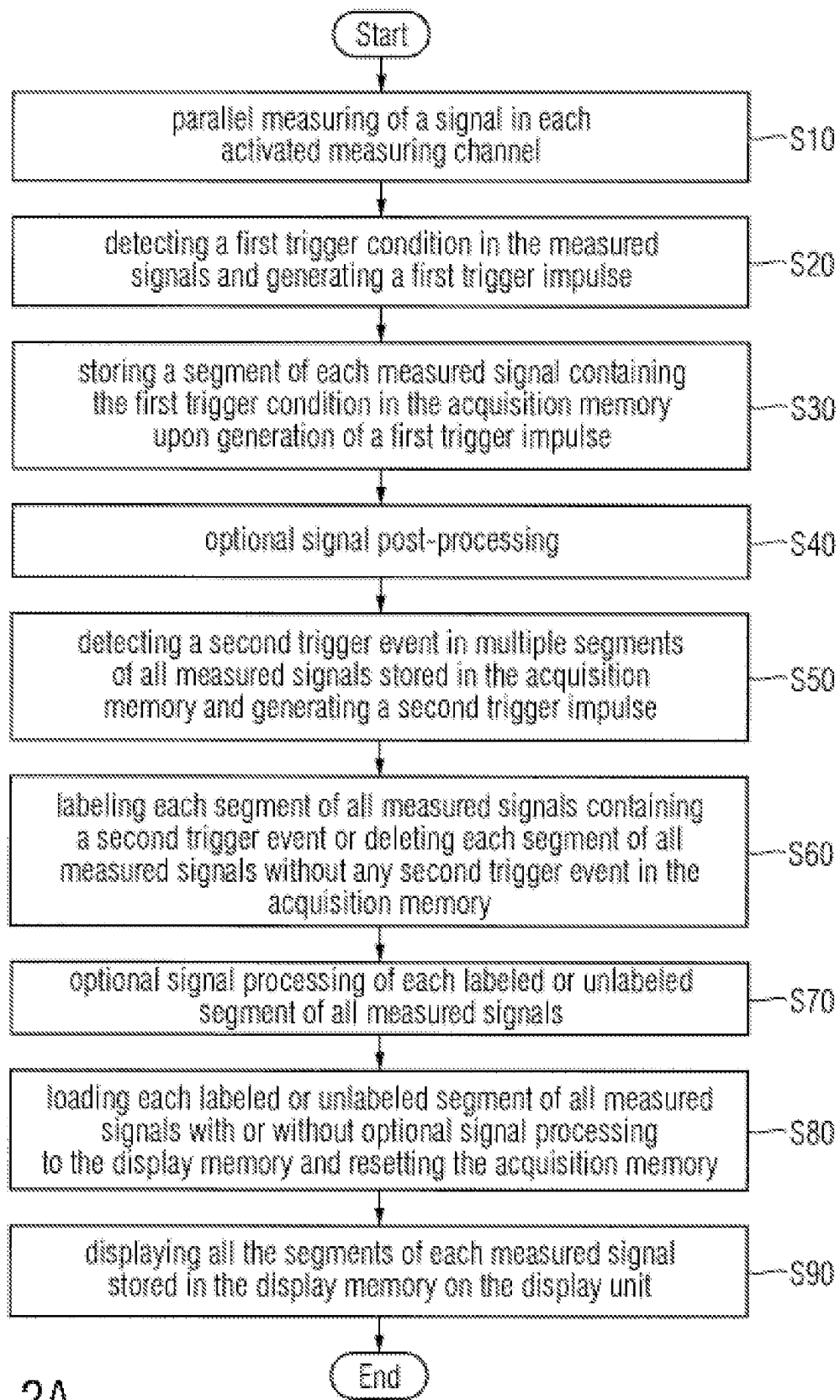
Figure 2B:
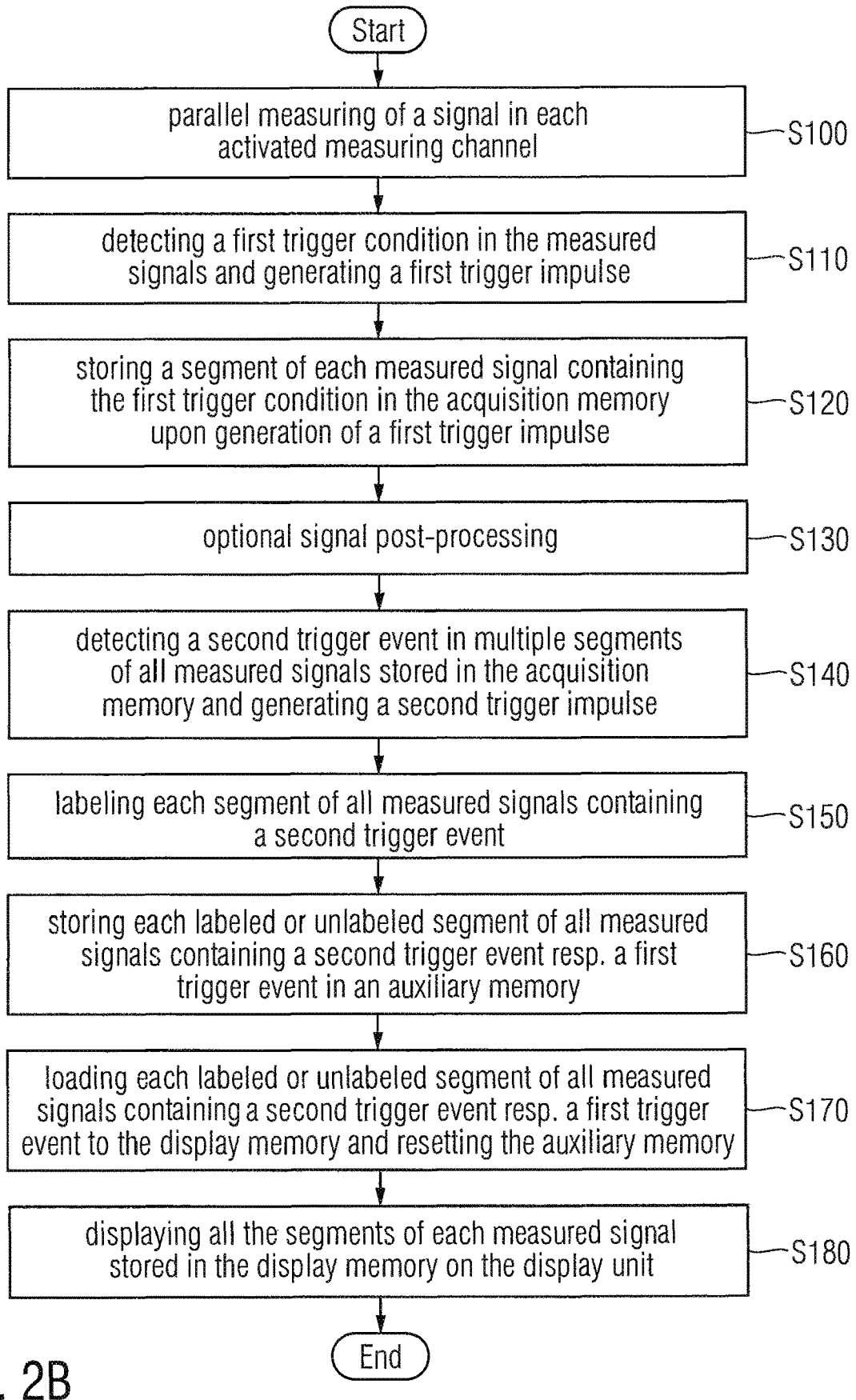
Figure 2C:
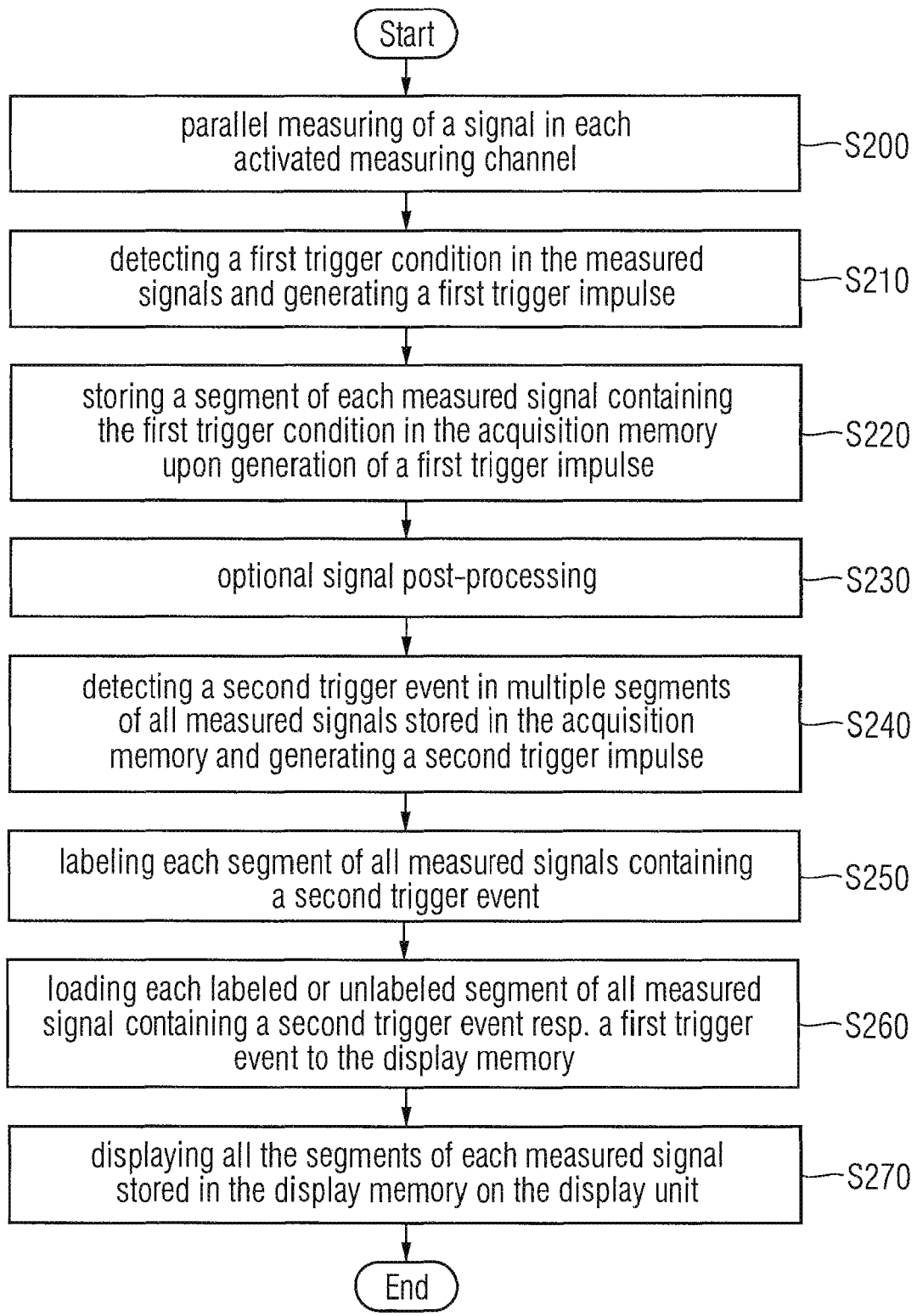

All labeled and unlabeled segments of each measured signal are transferred via the second trigger unit 5 to an auxiliary memory 9 succeeding the second trigger unit 5 according to FIG. 1B and are stored in that auxiliary memory 9 in the next method step S160.

In the next method step S170 all the labeled segments of each measured signal, i.e. segments containing both a first trigger event and a second trigger event, and all the unlabeled segments of each measured signal, i.e. segments containing only a first trigger event, are transferred to the display memory 7 succeeding the auxiliary memory 9 and are stored as pixel data in the display memory 7.

The last method step S180 of the second embodiment of the invention corresponds to the last method step S90 of the first embodiment of the invention.

The first method steps S200 to S250 of the third embodiment of the inventive method according to FIG. 2C correspond to the first method steps S100 to S150 of the second embodiment of the inventive method according to FIG. 2B and consequently are now not described repetitively.

Figure 1C:
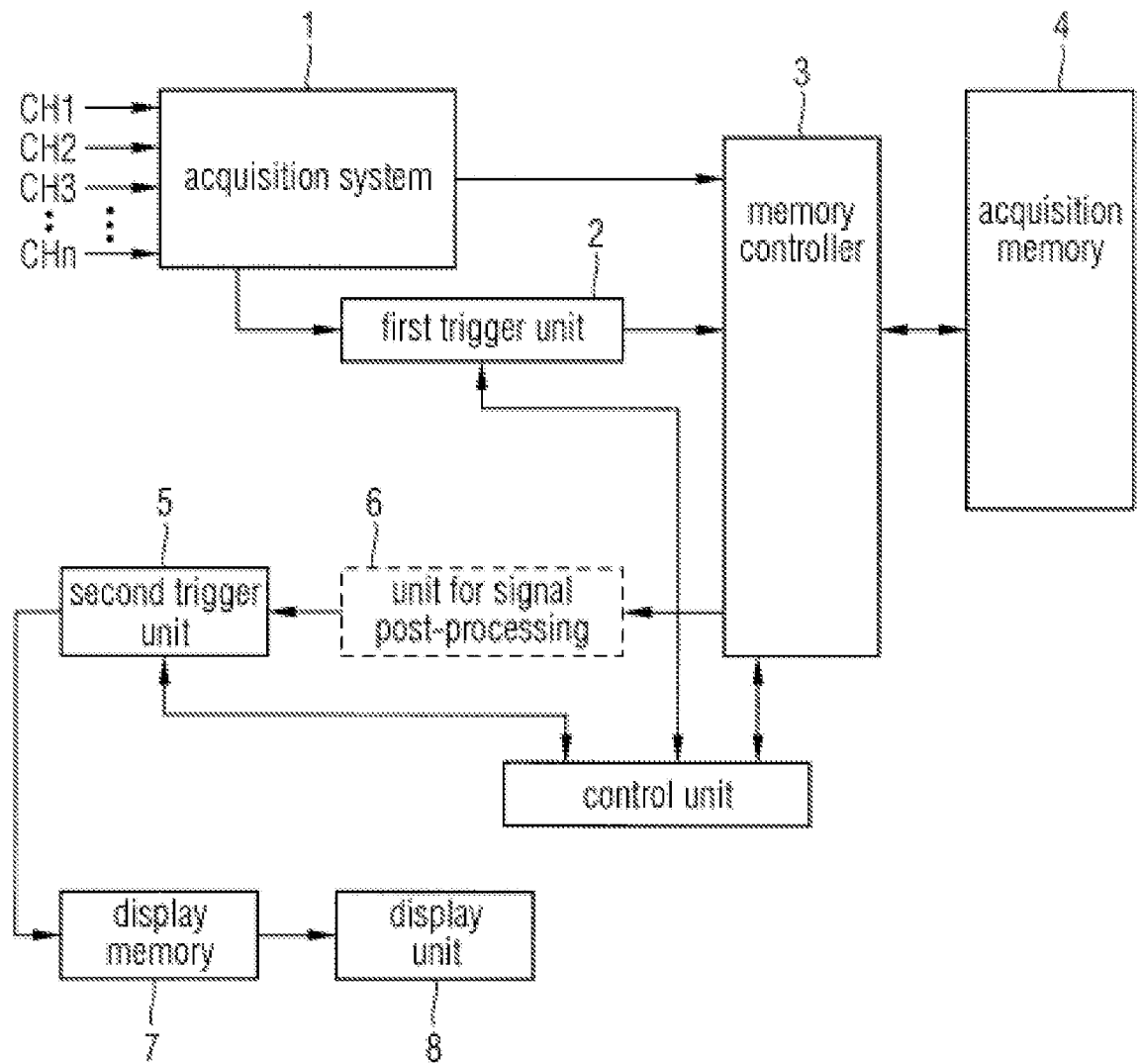

In the next method step S260 of the third embodiment of the inventive method all labeled and unlabeled segments of each measured signal are loaded via the second trigger unit 5 to the display memory 7 succeeding the second trigger unit 5 according to FIG. 1C and are stored as pixel data in that display memory 7.

The last method step S270 of the third embodiment of the invention corresponds to the last method step S90 of the first embodiment of the invention.

The invention is not restricted to the exemplary embodiments and exemplary variants. Advantageously, all the features described above or features shown in the figures of the drawings or features claimed in all the claims can be combined with one another arbitrarily within the scope of the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement device comprising:
a first trigger unit, an acquisition memory, a second trigger unit, and a display unit;
wherein the first trigger unit is configurable to generate a first trigger impulse upon detection of a first trigger condition in at least one signal of multiple signals to be measured in a corresponding activated measuring channel from one of multiple channels,
wherein the acquisition memory is configurable to store for the at least one signal, multiple segments, each containing the detected first trigger condition, upon generation of the first trigger impulse,
wherein the second trigger unit includes a modulation trigger and is configurable to generate a second trigger impulse upon detection of a second trigger condition in the multiple segments of the at least one signal stored in the acquisition memory,
wherein the display unit is configurable to display, for the at least one signal, the multiple segments containing the detected second trigger condition upon generation of the second trigger impulse,
wherein the first trigger unit is configured such that, in case of the multiple measured signals, a combination of several trigger functions for each of the measured signals is used in the first trigger condition,
wherein the second trigger unit is configured to evaluate the multiple segments stored in the acquisition memory repeatedly,
wherein the second trigger condition is performed in offline mode which does not represent a real-time mode,
wherein the multiple segments in the each measured signal comprises a pre-trigger range preceding a detected trigger event and a post-trigger range succeeding the detected trigger event, and
wherein both a length of the pre-trigger range and a length of the post-trigger range is selectable by a user.

2. The measurement device according to claim 1,
wherein the display unit is further configurable to display additionally for the at least one signal the segments without containing any detected second trigger condition.

3. The measurement device according to claim 2,
wherein the display unit is further configurable to display the segments containing the detected second trigger condition in another visual type as the segments without containing any detected second trigger.

4. The measurement device according to claim 3,
wherein the another visual type is a color or a type of a line in which the corresponding segment is displayed.

5. The measurement device according to claim 1,
wherein the display unit is configurable to display the at least one segment of the at least one signal containing the detected second trigger in another display area as the segments of the at least one signal without containing the detected second trigger condition.

6. The measurement device according to claim 1,
wherein the second trigger unit is configurable to use a trigger mask defined by the user of the measurement device.

7. The measurement device according to claim 6,
wherein the display unit is configured to display only the at least one segment of the at least one signal containing the detected second trigger condition which is positioned only inside the trigger mask or only outside the trigger mask.

8. The measurement device according to claim 1,
wherein the second trigger unit is further configurable to detect a second trigger condition in a time-domain signal.

9. The measurement device according to claim 1,
wherein the second trigger unit is further configurable to detect a second trigger condition in a frequency-domain signal.

10. The measurement device according to claim 1,
wherein the first trigger unit and the acquisition memory are realized in real-time mode.

11. The measurement device according to claim 1,
wherein the acquisition memory is configurable to store the multiple segments containing the detected first trigger condition for the at least one signal over a long period of time.

12. A method for measuring at least one signal comprising:
generating a first trigger impulse upon detection of a first trigger condition in the at least one signal of multiple signals in a corresponding activated measuring channel from one of multiple channels,
storing for the at least one signal multiple segments each containing the detected first trigger condition upon generation of the first trigger impulse,
generating, by a modulation trigger, a second trigger impulse upon detection of a second trigger condition in the stored segments of the at least one signal,
displaying for at least one of the stored segments each containing the detected second trigger condition upon generation of the second trigger impulse,
wherein in case of the multiple measured signals a combination of several trigger functions for each of the measured signals is used in the first trigger conditions,
wherein the stored multiple segments are evaluated repeatedly,
wherein the second trigger condition is performed in offline mode which does not represent a real-time mode, wherein the multiple segments in the each measured signal comprises a pre-trigger range preceding a detected trigger event and a post-trigger range succeeding the detected trigger event, and wherein both a length of the pre-trigger range and a length of the post-trigger range is selectable by a user.

13. The method according to claim 12, wherein segments containing the detected first trigger condition are displayed in another visual type as the segments without containing the detected second trigger condition.

14. The method according to claim 12, wherein at the second trigger condition a trigger mask is used.

15. The method according to claim 14, wherein for the at least one signal only segments which are positioned inside the trigger mask are displayed or only segments which are positioned outside the trigger mask are displayed.

16. The method according to claim 12, wherein the generation of the first trigger impulse and the storage of segments of the at least one signal each containing the detected first trigger condition are performed in real-time mode.

17. The method according to claim 12, wherein the stored segments of the at least one signal containing a detected second trigger event are labeled in an acquisition memory, whereas the stored segments of the at least one signal without any detected second trigger event remain unlabeled in the acquisition memory.

18. The method according to claim 12, wherein each segment of the at least one signal with a detected second trigger event is stored as labeled segment in an auxiliary memory succeeding a unit for signal post-processing directly after second triggering.

19. The method according to claim 12, wherein each segment of the at least one signal with a detected second trigger event is loaded as labeled segment in a display memory directly after second triggering.

20. The method according to claim 12, wherein the storing the multiple segments each containing the detected first trigger condition for the at least one signal includes storing over a long period of time.

* * * * *